US006013538A

United States Patent [19]
Burrows et al.

[11] Patent Number: 6,013,538
[45] Date of Patent: Jan. 11, 2000

[54] METHOD OF FABRICATING AND PATTERNING OLEDS

[75] Inventors: Paul Burrows, Princeton Junction; Stephen R. Forrest; Peifang Tian, both of Princeton, all of N.J.

[73] Assignee: The Trustees of Princeton University, Princeton, N.J.

[21] Appl. No.: 08/977,205

[22] Filed: Nov. 24, 1997

[51] Int. Cl.[7] .................................................. H01L 29/12
[52] U.S. Cl. ............................ 438/22; 438/23; 438/34; 438/35; 438/99; 257/40; 257/79; 257/88
[58] Field of Search ................................. 438/22, 23, 28, 438/29, 34, 35, 99; 257/12, 13, 40, 88, 89, 90, 96, 97, 100, 79

[56] References Cited

U.S. PATENT DOCUMENTS

| 5,294,870 | 3/1994 | Tang ........................................ 313/504 |
| 5,552,547 | 9/1996 | Shi . |
| 5,641,611 | 6/1997 | Shieh et al. ................................ 438/35 |

FOREIGN PATENT DOCUMENTS

WO 96/19792   6/1996   WIPO .

OTHER PUBLICATIONS

Noach et al., "Microfabrication of an electroluminescent polymer light emitting diode pixel array", Appl. Phys. Lett. 69 (24), Dec. 9, 1996, pp. 3650–3652.

M. Hatzakis, "Multilayer Resist Systems for Lithography", Solid State Technology, Aug. 1981, pp. 74–80.

Witman et al., "A Simple Bilayer Lift–Off Process", Microelectronic Engineering, 11 (1990) pp. 549–552.

V. Bouchait and D. Esteve, "Lift–Off lithography using an atomic force microscope", Appl. Phys. Lett. 69(20, Nov. 11, 1996, pp. 3098–3100.

C. Hosokawa, "L2.3: Organic Multicolor EL Display with Fine Pixels", SID 97 Digest, pp. 1073–1076.

J.M. Moran and D.J. Maydan, "High resolution, steep profile resist patterns", J. Vac. Sci. Technol., 16(6), Nov./Dec. 1979, pp. 1620–1624.

W.R. Runyan & K.E. Bean, Semiconductor Integreted Circuit Processing Technology, p. 560, Addison–Wesley, 1990.

E. Ong and E.L. Hu, "Multilayer Resists for Fine Line Optical Lithography," Solid State Technology, Jun. 1984.

T. Wakimoto, et al., "Stability Characteristics of Quinacridone and Coumarin Molecules as Guest Dopants in the Organic LEDs", 21–1–03 (Abstract).

*Primary Examiner*—Charles Bowers
*Assistant Examiner*—Keith Christianson
*Attorney, Agent, or Firm*—Kenyon & Kenyon

[57] ABSTRACT

A multiple layer patterning system with an undercut allows the deposition of a material onto a substrate from a direction substantially perpendicular to the substrate, followed by the angular deposition of a protective cap. Because of the angular deposition, the protective cap extends into the undercut and completely covers and surrounds any previously exposed surface of the material. The material is thereby protected from subsequent exposure to substances that may be deleterious.

19 Claims, 10 Drawing Sheets

METHOD OF FABRICATING AND PATTERNING OLEDS

This invention was made with Government support under Contract No. F33615-94-1-1444, awarded by the Defense Advanced Research Projects Agency. The Government has certain rights in this invention.

FIELD OF THE INVENTION

The present invention relates to fabrication and patterning methods for electronic devices, particularly vacuum deposited organic light emitting devices (OLEDs), and more particularly to photolithographic patterning methods using a patterning system with an overhang that allows a protective cap to be deposited over organic layers of an OLED, protecting the organic layers from exposure to deleterious substances, the OLEDs being suitable for producing commercial flat panel displays.

BACKGROUND OF THE INVENTION

Organic light emitting devices, which make use of thin film materials which emit light when excited by electric current, are becoming an increasingly popular technology for applications such as flat panel displays. Popular OLED configurations include double heterostructure, single heterostructure, and single layer, as described in PCT Application WO 96/19792, which is incorporated by reference.

OLED's may be fabricated using shadow mask technology. However, it is difficult to accurately align multiple layers of deposited material using shadow masks, and the masks tend to clog. Moreover, it is difficult to fabricate features smaller than about 300 microns using a shadow mask, whereas OLED devices smaller than about 100 microns by 100 microns, and possibly smaller than about 10 microns by 10 microns, are preferred for a high resolution, full color flat panel display.

An array of 20 micron×20 micron polymer LEDs has been fabricated using direct photo-ablation with the 193 nm. emission of an eximer laser. S. Noach et al, Appl. Phys. Lett. 69, 3650, Dec. 9, 1996. While this dimension is suitable for a high resolution display, the low speed of laser photoablation are undesirable for commercialization.

Photolithographic patterning involves the use of photoresist to create patterns in a material deposited on a substrate, and can be used to pattern materials and fabricate devices on a submicron scale, much smaller than can be achieved with shadow mask technology. Photolithographic patterning is also well suited to commercialization, because it can be used to quickly fabricate large panels. However, the organic materials used to fabricate OLEDs may be degraded from exposure to deleterious substances such as water, solvents, developers, and even atmospheric conditions. In particular, many of the chemicals used in photolithographic processing, such as solvents and developers used to wash away photoresist, may rapidly degrade such organic materials. Great care should be taken to ensure that the organic materials are not exposed to deleterious substances during the patterning of top electrodes and afterward.

U.S. Pat. No. 5,294,870 to Tang discloses the use of a series of parallel walls formed by photolithography prior to deposition of an organic EL layer such that photolithographic patterning steps or wet chemistry are not required after the organic EL medium is deposited.

It is known to use a multi-layer photoresist system with an overhang to deposit materials with sloped edges. W. R. Runyan & K. E. Bean, Semiconductor Integrated Circuit Processing Technology, p. 560, Addison-Wesley, 1990. It is also known to use a photoresist system with an overhang to deposit small features, and to facilitate the lift-off of photoresist after material has been deposited in applications such as the fabrication of narrow gate gallium arsenide transistors.

SUMMARY OF THE INVENTION

The present invention provides a technique for fabricating OLED devices using photolithography while reducing the possibility of contamination of the organic layers by deleterious substances such as solvents, developers, water, air or other environments which can degrade such organic layers. In accordance with the present invention, it is possible to use chemicals that are deleterious to the organic materials used in OLEDs both before and after the organic material is deposited. The present invention therefore allows the fabrication of OLED devices on the small scale made possible by photolithography.

The present invention uses a patterning system with an overhang and an undercut such that a protective cap can be deposited using the same patterning system used to deposit the organic layer. First, the organic layer is deposited from a direction substantially perpendicular to the substrate on which the patterning system is formed. Then, the protective cap is deposited from an angle, such that it is deposited into the undercut as well as onto the organic layer. As a result, the protective cap completely covers the organic layer, i.e., the protective cap is deposited on top of and around the organic layer such that the organic layer is no longer exposed from any direction. Preferably, the protective cap is deposited over the organic layer without removing the organic layer from vacuum. Once the protective cap is deposited, the organic layer is protected from exposure to deleterious substances such as developers and solvents used in subsequent processing, air, and moisture. The protective cap may also increase the shelf-life as well as the operational life of OLED devices.

While the processes presented below relate to the fabrication of an OLED device, the present invention can be used to fabricate other vacuum deposited electronic devices that make use of materials which are sensitive to exposure to deleterious substances.

The present invention provides a method of fabricating an electronic device, e.g., an organic light emitting device, including the steps of forming on a substrate a patterning system having an undercut; depositing a material, e.g., an organic light emitting material, through the patterning system; and depositing a protective cap, which completely covers the material, through the patterning system.

The present invention further provides a method of fabricating an organic light emitting device, including the steps of depositing and patterning a bottom electrode onto a substrate; depositing and patterning an insulating strip over the result of said step of depositing and patterning a bottom electrode; forming a patterning system having an undercut over the result of said step of depositing an insulating strip; depositing an organic light emitting material through the patterning system; and depositing a protective cap, which completely covers the organic light emitting material, through the patterning system.

The present invention further provides an organic light emitting device, that includes a bottom electrode; an organic light emitting material electrically connected to said bottom electrode; and a protective cap electrically connected to and completely covering said organic light emitting material.

The present invention further provides an organic light emitting device, that includes a bottom electrode; a top electrode; an organic light emitting material electrically connected to said bottom electrode and said top electrode; and a protective cap completely covering said top electrode and said organic light emitting material.

The present invention further provides a stack of organic light emitting devices, that includes (a) a first device, having (i) a bottom electrode; (ii) an organic light emitting material electrically connected to said bottom electrode; (iii) a protective cap electrically connected to and completely covering said organic light emitting material; and (b) a second device stacked with said first device.

The present invention further provides a stack of organic light emitting devices, that includes (a) a first device having: (i) a bottom electrode; (ii) a top electrode; (iii) an organic light emitting material electrically connected to said bottom electrode and said top electrode; and (iv) a protective cap completely covering said top electrode and said organic light emitting material; and (b) a second device stacked with said first device.

The present invention further provides a patterning system, that includes an insulating layer deposited on a substrate; and a photoresist layer deposited on said insulating layer having an overhang that extends over an undercut formed in said insulating layer.

The present invention further provides a method of forming a patterning system, comprising: depositing an insulating layer onto a substrate; depositing a photoresist layer onto the insulating layer; patterning the photoresist layer; and wet etching the insulating layer to form an undercut under the photoresist layer.

DETAILED DESCRIPTION

The present invention will be described with reference to the illustrative embodiments in the following processes and drawing figures.

Figure 1:
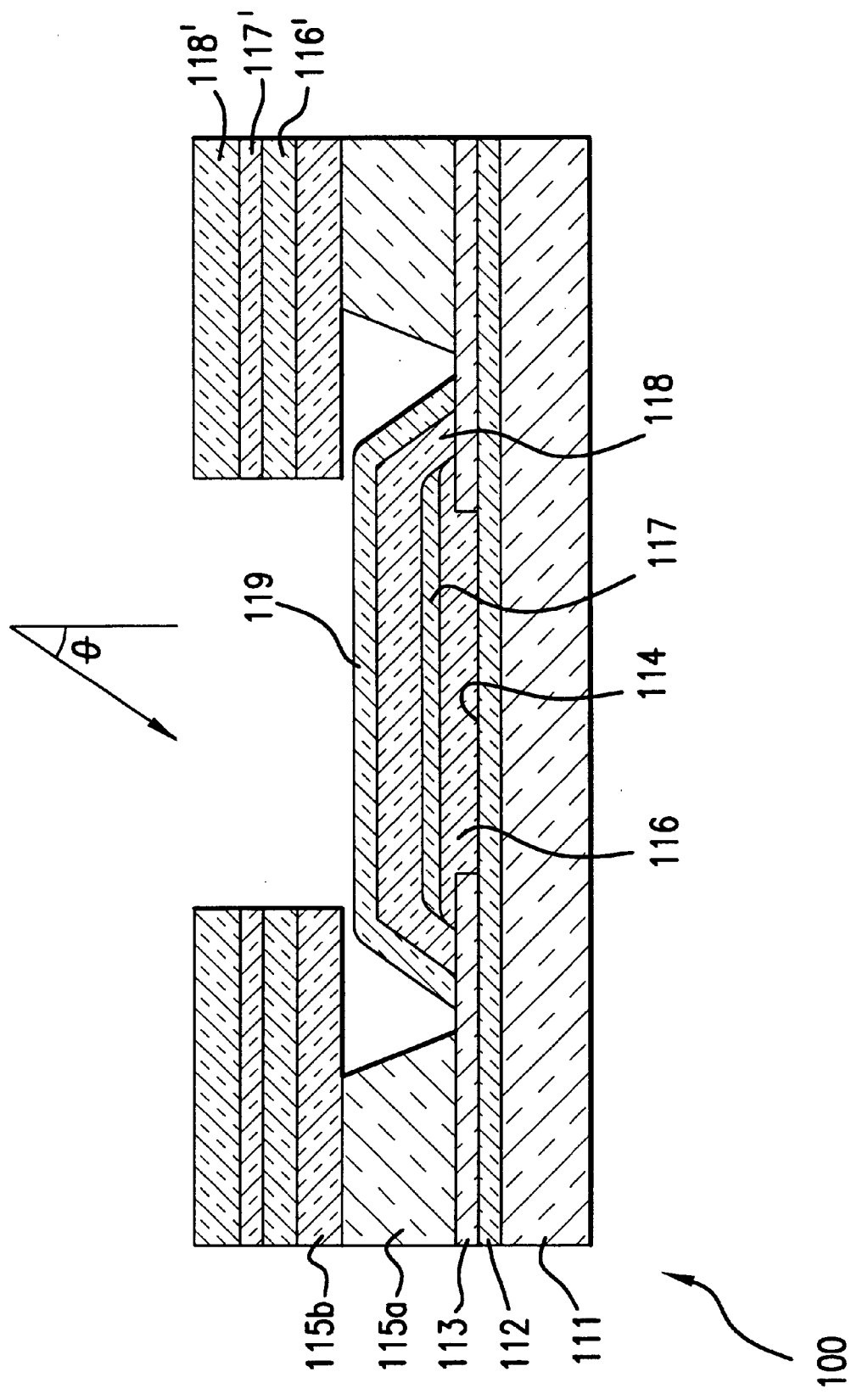
FIG. 1 is a cross-section of an embodiment of the present invention
Figure 2:
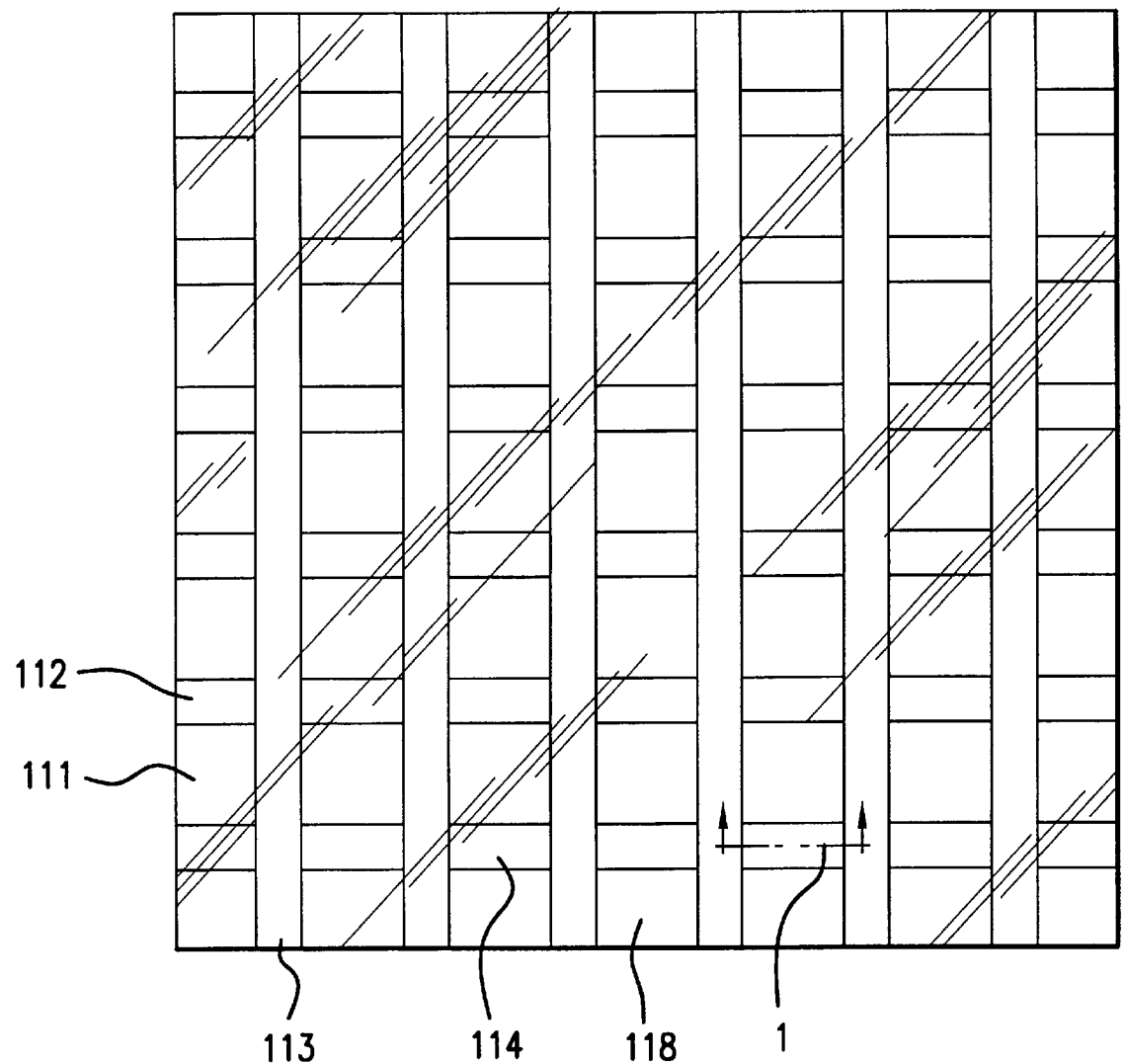
FIG. 2 is a plan view of an array of devices, where a single device of the array is depicted by FIG. 1.

FIG. 1 is a cross-section of a single device 100, an embodiment of the present invention, and FIG. 2 is a plan view of an array of devices 100. FIG. 1 is a cross-section of FIG. 2 at line 1'. In the interest of clarity, FIG. 2 does not depict patterning system 115 nor layers 116', 117' and 118'.

As shown in FIG. 1, device 100 comprises a substrate 111, a bottom electrode 112, an insulating strip 113, organic layer(s) 116, a top electrode 117, and a protective cap 118. Organic layer(s) 116 emit light when a voltage is applied across organic layer(s) 116 between emitting region 114 of bottom electrode 112 and top electrode 117. Protective cap 118 protects organic layer(s) 116 and top electrode 117 from exposure to deleterious substance. Light emitted from organic layer(s) 116 is typically transmitted through substrate 111 to a viewer, although light may be transmitted away from substrate 111 to a viewer if all layers deposited after organic layer(s) 116 are transparent. The emission of light from each device 100 in an array may be individually controlled using multiplexing techniques known in the art.

Patterning system 115 is used to deposit organic layer(s) 116, top electrode 117, and protective cap 118, as will be described below. Layers bearing a prime designation in FIG. 1, i.e., layers 116', 117' and 118', need not contribute to the operation of device 100, and are merely a by-product of the deposition of organic layer(s) 116, top electrodes 117 and protective caps 118, respectively.

The size and spacing of devices 100 may be determined by the intended use of the array of devices 100. For example, devices 100 with emitting regions 114 and organic layer(s) 116 less than about 100 microns by 100 microns may be used for a high resolution display screen, while larger emitting regions 114 and organic layer(s) 116 may be used for lower resolution displays. It may be possible to fabricate emitting regions 114 and organic layer(s) 116 as small as 10 microns by 10 microns using presently available lithographic techniques, and it is contemplated that, as advances in photolithography permit smaller features and higher resolutions, the present invention could be practiced at even higher resolutions.

A process for fabricating an OLED device 100 in accordance with an embodiment of the present invention will now be described with reference to FIGS. 1 and 2:

1) Deposit bottom electrodes 112 onto substrate 111. Substrate 111 and bottom electrodes 112 should be transparent, i.e., the material, at the thickness used, is capable of transmitting light of the wavelengths emitted by device 100, and more preferably transmitting substantially all of the light emitted. Preferably, substrate 111 is made of glass, quartz, sapphire or plastic. Bottom electrodes 112 are usually anodes, which carry electrons away from organic layers(s) 116, although bottom electrodes 112 can be cathodes. Bottom electrodes 112 can be any suitable conductive material, including indium tin oxide ("ITO"). Bottom electrodes 112 should be thin enough to minimize the absorption of light, yet thick enough to have a low resistivity. Preferably, bottom electrodes 112 are ITO, deposited to a thickness of about 200 Å to 1 micron, and more preferably deposited to a thickness of about 1500 Å. The patterning of bottom electrodes 112 can be done by any suitable technique, such as etching in the presence of a photoresist layer (subtractive photolithography) or by lift-off (additive photolithography). By way of example, bottom electrodes 112 can be about 50 microns in width and spaced with a period of about 150 microns, i.e., about 150 microns center-to-center.

Figure 3:
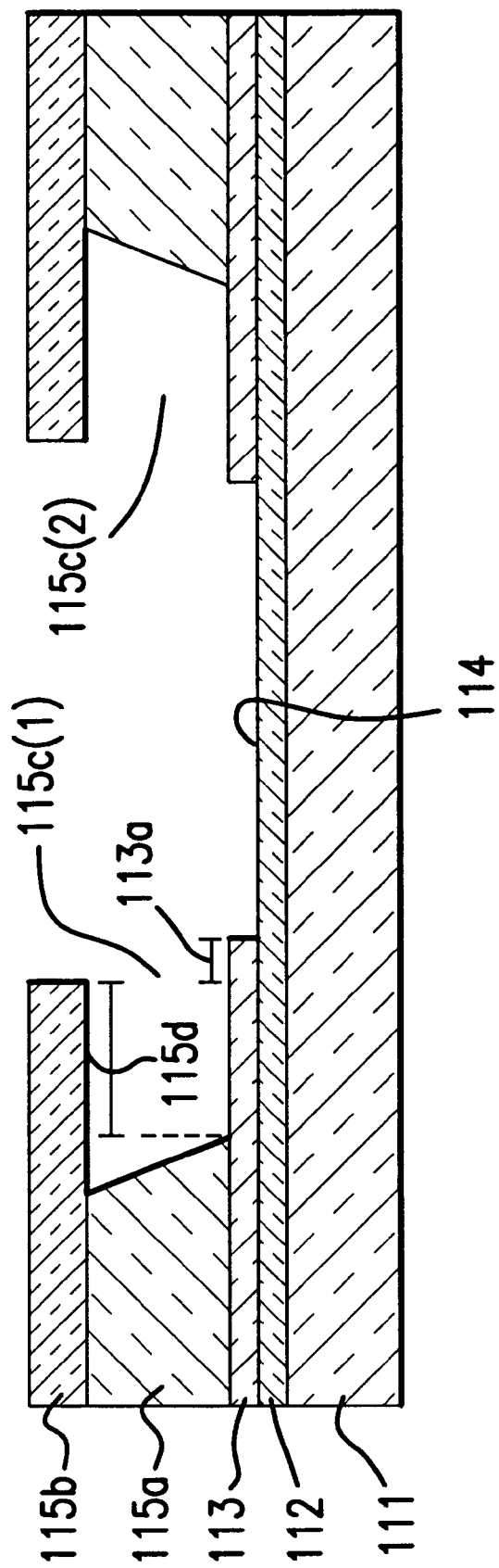
FIG. 3 is a cross-section of a patterning system with an insulating layer used to fabricate the present invention.

2) Deposit insulating strips 113 over bottom electrodes 112. Insulating strips 113 prevent direct contact between bottom electrodes 112 on one hand and top electrodes 117 and protective caps 118 on the other. Insulating strips 113 can be any suitable insulating material, including $SiO_x$, $TiO_2$, $SiN_x$ or polyimide. Insulating strips 113 should be thick enough to provide adequate insulation, but not so thick as to cause problems with subsequent processing. Preferably, insulating strips 113 are deposited to a thickness of about 1000–3000 Å, and more preferably to a thickness of about 2000 Å. The patterning of insulating strips 113 can be done by any suitable technique. The width of insulating strips 113 is determined by adding the width of insulating layer 115a, the width of overhang 115d, and allowing for an insulating patterning tolerance 113a of about 1 to 2 microns as indicated in FIG. 3. Insulating patterning tolerance 113a prevents shorting between bottom electrodes 112 and top electrodes 117 or protective caps 118. The surface of bottom electrodes 112 that remain exposed after insulating strips 113 are deposited are referred to as emitting regions 114. Emitting regions 114 can have any width larger than about 0.5 microns, and preferably have a width of about 10 to 100 microns.

3) Form patterning system 115 over insulating strips 113. A process for forming a patterning system 115 in accordance with a preferred embodiment of the present invention is described in detail below. Patterning system 115 has an undercut 115c, which includes undercuts 115c(1) and 115c(2), underneath overhang 115d, as illustrated in FIG. 3, which allow for the formation of protective caps 118. Patterning system 115 can be any system capable of forming undercut 115c and overhang 115d. Patterning system 115 may be a multi-layer patterning system, such as a bi- or tri-layer photoresist system. Preferably, patterning system 115 comprises an insulating layer 115a and a photoresist layer 115b. Preferably, overhang 115d should be large enough that organic layer(s) 116 do not touch patterning system 115, such that protective cap 118 may completely cover organic layer(s) 116, particularly if bi- or tri- layer photoresist system is used. It may be permissible for organic layer(s) 116 to touch insulating layer 115a. Overhang 115d preferably extends about 1 to 10 microns over insulating layer 115a, more preferably about 1 to 5 microns, and most preferably about 2 microns. As shown in FIG. 3, the extension of overhang 115d over insulating layer 115a is measured with respect to the width of that portion of insulating layer 115a where that layer contacts insulating strip 113. Overhang 115d should not completely overhang insulating strips 113, i.e., the openings in photoresist layer 115b should be larger than emitting regions 114 by the width of insulating patterning tolerance 113a on each side.

4) Deposit organic light emitting layer(s) 116 over emitting regions 114 and insulating patterning tolerance 113a. Depositing organic light emitting layer(s) 116 over insulating patterning tolerance 113a prevents contact and shorting between top electrodes 117 and bottom electrodes 112. Organic light emitting layer(s) 116 may be deposited from a direction substantially perpendicular to substrate 111, such that a portion of insulating strips 113 underneath overhang 115d is not covered by deposited organic layer(s) 116 (FIG. 1).

5) Optionally, deposit top electrodes 117 over organic layer(s) 116. Top electrodes 117 are usually cathodes, which carry electrons to organic layers(s) 116, although top electrodes 117 can be anodes. Top electrodes 117 can be any suitable material, such as Mg, Mg/Ag, and Li/Al. Top electrodes 117 should be thick enough to have a low resistivity. Damage to organic layer(s) 116 should be avoided during the deposition of top electrodes 117 and subsequently deposited layers. For example, organic layer(s) 116 should not be heated above their glass transition temperature. Top electrodes 117 are preferably deposited to a thickness of about 50 Å to 5000 Å, and more preferably to a thickness of about 1000 Å. Top electrodes 117 are preferably formed by thermal evaporation and preferably deposited from a direction substantially perpendicular to substrate 111. This step is optional because protective caps 118 may also serve the function of top electrodes 117, in which case top electrodes 117 would not be required.

6) Deposit protective caps 118, e.g., so that they completely cover electrodes 117 and organic layer(s) 116, from an angle $\theta$ measured from a direction substantially normal to substrate 111. Angular deposition may be accomplished by any technique that allows the material of protective caps 118 to deposit into undercut 115c and completely cover organic layer(s) 116 and top electrode 117. For example, substrate 111 may be rotated by a planetary rotating mechanism under a point source positioned at an angle $\theta$ from the normal to substrate 111. Alternatively, substrate 111 may be held stationary while protective cap 118 is deposited from an angle $\theta$ into undercut 115c(1), and then moved to a new position where it is held stationary while protective cap 118 is deposited into undercut 115c(2), shown in FIG. 3. After protective caps 118 are deposited, top electrodes 117 and organic layer(s) 116 are completely covered and are therefore protected from subsequent exposure to deleterious substances. Preferably, protective caps 118 are formed of Al, Li/Al, Ag, Au or ITO. Protective caps 118 are preferably about 0.5 to 5 microns thick, more preferably about 0.5 to 2 microns thick, and most preferably about 1 micron thick. Protective caps 118 are preferably wider than protected electrodes 117 and organic layer(s) 116 by about 1 to 10 microns, more preferably by about 1 to 4 microns, and most preferably by about 2 microns, i.e., preferably by about 0.5 to 5 microns on each side, more preferably by about 0.5 to 2 microns on each side, and most preferably by about 1 micron on each side. The extent to which protective caps 118 are wider than organic layer(s) 116 may be limited by the height of insulating layer 115a, the angle of deposition of protective caps 118, and the width of undercut 115c. Preferably, steps (5) and (6) are performed without removing device 100 from vacuum, such that device 100 is never exposed to any potentially deleterious substance, such as air, oxygen or water vapor, until after organic layer(s) 116 are covered by protective caps 118, although device 100 may be exposed in between steps to a nondegrading environment, such as an inert gas, to facilitate the deposition of different materials or deposition from different angles.

7) Optionally, remove patterning system 115, and layers 116', 117' and 118' deposited on top of patterning system 115, using a suitable solvent, such as acetone. This step is referred to as "lift-off." Protective caps 118 protect organic layer(s) 116 from exposure to solvent during lift-off. Note that if a patterning system 115 with an insulating layer 115a is used, as opposed to a patterning system 115 with multiple photoresist layers, insulating layer 115a will not be removed by lift-off, and will remain as a permanent part of device 100. If the optional lift-off step is not performed, layers 116', 117', and 118', as well as photoresist layer 115b, will remain, but will not contribute to the operation of device 100.

8) Optionally, deposit a passivation layer 119 over protective caps 118 to passivate the entire system. Passivation layer 119 can be any suitable material, such as $SiO_x$, and can be deposited by any suitable means, such as electron-beam deposition. Organic layer(s) 116 should not be heated to their glass transition temperature or above during deposition of passivation layer 119. Typical glass transition temperatures for organic layer(s) 116 include the range from about 63° C. to 150° C. Passivation layer 119 should completely cover protective caps 118, which can be accomplished by depositing passivation layer 119 after the optional lift-off of step (7) has been performed, or by depositing passivation layer 119 through patterning system 115 at an angle θ greater than the angle e from which protective caps 118 were deposited.

In one embodiment, the deposition of top electrodes 117 is omitted from step (5) of the process for fabricating an OLED device 100, and protective caps 118, deposited by angular evaporation, serve as an electrode in place of top electrodes 117 as well as protecting the underlying organic layer(s) 116. In this embodiment, the material chosen for protective caps 118 should be a good conductor and be able to make good electrical contact with organic layer(s) 116 as well as be able to block the penetration of deleterious substances to organic layer(s) 116. Li/Al is a preferred material for protective caps 118 in this embodiment.

A process for forming a patterning system 115 in accordance with a preferred embodiment of the present invention will now be described with reference to FIG. 3, which shows patterning system 115 as it appears before steps subsequent to step (3) of the process for fabricating an OLED device 100 are performed:

1) Deposit an insulating layer 115a over bottom electrode 112 and insulating strip 113. Insulating layer 115a is preferably deposited to a thickness of about 1 to 3 microns, and more preferably to a thickness of about 2 microns. Insulating layer 115a can be made of any insulating material that can be etched, and preferably wet etched, to form undercut 115c. For example, insulating layer 115a can be made of SiO, $SiO_2$, or $SiN_x$ deposited by e-beam or plasma enhanced chemical vapor deposition, or polyimide deposited by spinning.

2) Deposit photoresist layer 115b by spinning onto insulating layer 115a to a thickness of about 1 to 3 microns, preferably 1 to 2 microns. A photoresist thickness from the lower end of the range should be chosen when smaller features, i.e., 10 micron wide organic layer(s) 116, are to be fabricated. Photoresist layer 115b can be made of a photoresist such as AZ4210 or AZ4110, from Hoechst Celanese Corporation, for example.

3) Soft bake photoresist layer 115b at a temperature and time which depend on the material of photoresist layer 115b and the baking method. For example, if AZ4210 is used, the soft bake may be for 3 minutes at 105° C. on a hot plate.

4) Expose photoresist layer 115b over emitting regions 114, using a mask having an exposure larger than emitting regions 114, and develop. While it is possible to use a positive photoresist as described, i.e., a photoresist that can be removed by developer only where exposed to radiation, it is also possible to practice the present invention using a negative photoresist, i.e., a photoresist that can be removed in developer only where not exposed to radiation, by using a different mask. After developing, photoresist layer 115b may be post-baked to increase resistivity to wet etchants and adhesion to insulating layer 115a. Post-bake time, temperature and method depend on the particular photoresist and etchants involved. In the case of AZ4210 photoresist and BOE etchant, a post-bake at about 105° C. for about 3 to 10 minutes on a hot plate may be used.

5) Wet etch insulating layer 115a, forming undercut 115c and overhang 115d. By controlling the etch temperature, etch time, etchant concentration, etchant stir speed, the thickness to which insulating layer 115a is deposited, and the method used to deposit insulating layer 115a, the size of undercut 115c can be controlled. For example, 70 ml buffered oxide etchant, such as BOE (10:1), i.e., 36.5% (w/w) ammonium fluoride, 4.5% (w/w) hydrofluoric acid, and 59% (w/w) deionized water, available from J. T. Baker, mixed with 5 ml hydrofluoric acid (49% in deionized water) can be used at 20° C. for 4.5 minutes at a stir speed of 400 rpm to etch a 2 micron thick $SiO_2$ insulating layer 115a deposited by plasma enhanced chemical vapor deposition to form a 10 micron undercut 115c, which also results in a 10 micron overhang 115d. A smaller undercut 115c of 2 microns can be obtained by using buffered oxide etchant at 21° C. for 8 minutes with no stir on a 1.7 micron thick $SiO_2$ insulating layer 115a deposited by electron beam evaporation. Preferably, the etchant used to etch insulating layer 115a etches insulating strips 113 or bottom electrodes 112 only minimally, and more preferably does not etch insulating strips 113 or bottom electrodes 112 at all. For example, if buffered oxide etchant is used to etch insulating layer 115a, it is preferred that insulating strips 113 are sputter deposited $TiO_2$ or polyimide deposited by spin coating. Note that insulating layer 115a of patterning system 115 may not be removed by the optional lift-off step, but photoresist layer 115b, as well as layers 116', 117' and 118', can be removed.

Alternatively, patterning system 115 may be a bi-layer or tri-layer photoresist system with an undercut. Bi-layer and tri-layer photoresist systems are disclosed in M. Hatzakis, "Multilayer resist Systems for Lithography", Solid State Technology, August 1981, pp. 74–80; E. Ong and E. L. Hu, "Multilayer Resists for Fine Line Optical Lithography", Solid State Technology, June 1984; J. M Moran and D. J. Magdan, J. Vac. Sci. Tech. 16, 1620 (1979), which are incorporated by reference. However, patterning system 115 with an insulating layer 115a facilitates the formation an undercut 115c larger than about 1 micron and is therefore preferred over tri-layer and bi-layer photoresist systems. Other methods of forming a patterning system 115 with an undercut 115c may also be suitable for use in the present invention.

A process for fabricating a stack of devices 100 in accordance with an embodiment of the present invention will now be described with reference to FIG. 4:

1) Fabricate a device 100R as described in the process for fabricating an OLED device 100, with organic layer(s) 116(R) capable of emitting red light. All layers of device 100R through which light is to be transmitted should be transparent, including optional top electrodes 117 and protective caps 118, such that light from subsequently deposited devices 100 can be transmitted through device 100R. For this reason, ITO is a preferred material for protective cap 118.

2) Deposit a separation layer 121 over the device 100R fabricated in step (1). Separation layer 121 can be made of any transparent insulating material, such as $SiO_x$, $SiN_x$, or $Al_2O_3$.

3) Fabricate device 100G as described in the process for fabricating an OLED device 100, with organic layer(s) 116(G) capable of emitting green light, on top of separation layer 121, i.e., separation layer performs the function of substrate 111. Similar to device 100R, all layers of device 100G should be transparent.

4) Repeat steps (2) and (3), fabricating device 100B, with organic layer(s) 116(B) capable of emitting blue light, instead of device 100G. Top electrode 117 and protective cap 118 of device 100B, the final device 100 to be deposited, need not be transparent, and may be reflective to enhance the intensity of light transmitted through substrate 111 to a viewer.

The conditions under which devices 100 are fabricated should be such that organic layer(s) 116 of previously deposited devices 100 are not damaged. For example, organic layer(s) 116 should not be heated above their glass transition temperatures. As a result, it may be necessary to select organic layer(s) 116 of with a high glass transition temperature and photoresists used in patterning system 115 with a low bake temperature.

Alternatively, protective layer 118 of a previously deposited device 100, such as device 100R, can serve as bottom electrode 112 of a subsequently deposited device 100, such as device 100G. In this embodiment, the insulating protective layers 121 are not necessary.

Figure 4:
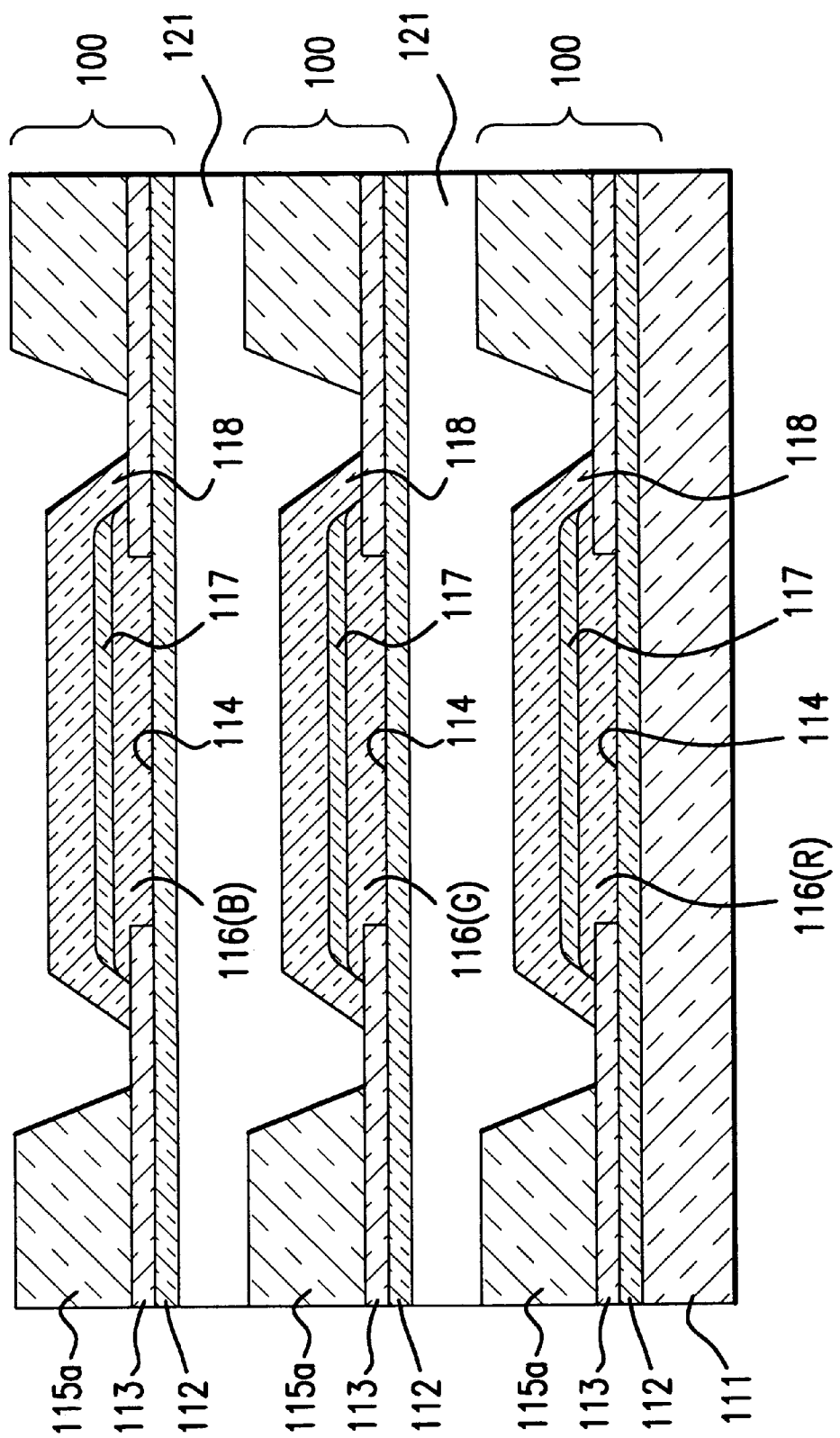
FIG. 4 is a cross-section of a stacked embodiment of the present invention.

As shown in FIG. 4, each device 100 in the stack can contain different materials in organic layer 116, and can emit different colors. For example, a red OLED device 100R with red emitting OLED layer(s) 116(R) can be fabricated as described above, then a green OLED device 100G with green emitting OLED layer(s) 116(G), then a blue OLED device 100B with blue emitting OLED material 116(B), all separated by separation layers 121, as shown in FIG. 4, to form a multicolor stack. Alternatively, each of the devices 100 in the stack may have the same EL material in OLED layer 116 in order to enhance intensity. The order of stacking in the latter embodiment is not critical, because each device 100R, 100G and 100B may be transparent to the light emitted by the other OLED devices 100. Factors that may influence the preferred stacking order include: transparency to the light emitted by other devices 100, i.e., put the more transparent devices 100 closer to the viewer; robustness, i.e., fabricate the least robust devices 100 last to reduce the chance of damage during subsequent processing; and brightness, i.e. put the devices 100 with the least intense emission closer to the viewer.

A preferred method of stacking OLED devices 100 is disclosed by U.S. application Ser. No. 08/976,666, attorney docket number 10020/25, entitled "Method for Deposition and Patterning of Organic Thin Film," by Bulovic, filed concurrently herewith, which is incorporated by reference.

Figure 5:
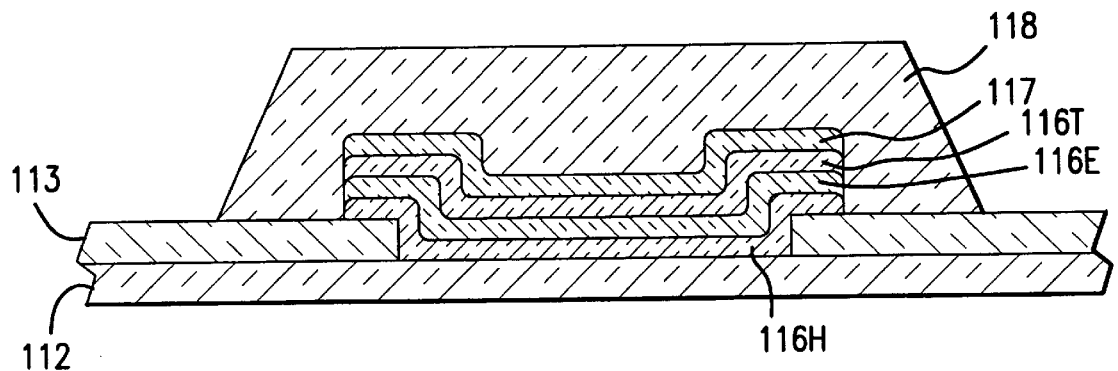
FIG. 5 is a cross-section of a double heterostructure embodiment, showing parts of the embodiment of FIG. 1 in greater detail.
Figure 6:
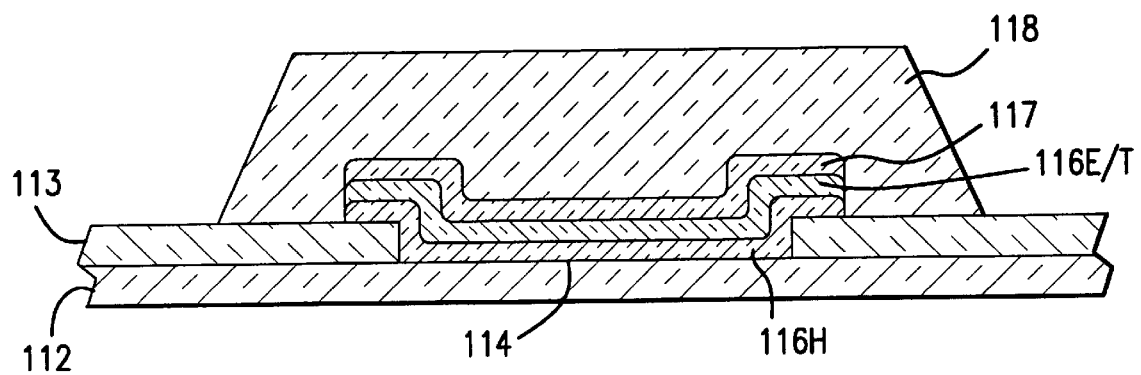
FIG. 6 is a cross-section of a single heterostructure embodiment, showing parts of the embodiment of FIG. 1 in greater detail.

In the various embodiments of the present invention, organic layer(s) 116 can be a single layer, or can comprise the multiple layers of a double or single heterostructure configuration, as shown in FIGS. 5 and 6, respectively. For simplicity, organic layer(s) 116 are shown as a single layer in the Figs., other than FIGS. 5 and 6, even though there may actually be multiple sub-layers. If, for example, a double heterostructure OLED is used in the present invention, organic layer(s) 116 will consist of an emission layer ("EL") 116E sandwiched between an hole transport layer ("HTL") 116H and an electron transport layer ("ETL") 116T as shown in FIG. 5. A double heterostructure OLED may be fabricated by following the steps of the process for fabricating an OLED device 100, wherein step (4) comprises the steps of sequentially depositing HTL 116H, EL 116E, and ETL 116T, all from a direction substantially perpendicular to substrate 111. HTL 116H, EL 116E, and ETL 116T are transparent because of their composition and thickness. Typical thicknesses for OLED layers include the following: HTL 116H may be about 50 Å to 1000 Å thick; EL 116E may be about 50 Å to 1000 Å thick; ETL 116T may be about 50 Å to 1000 Å thick, although variations from these ranges are possible. The lower ends of the above ranges allow optimum performance and low voltage operation. Examples of suitable organic ETL, EL, and HTL materials can be found in U.S. Pat. No. 5,294,870, and PCT Application WO 96/19792, which are incorporated by reference.

If a single heterostructure, rather than a double heterostructure, OLED structure is used, EL 116E and ETL 116T are replaced by a single multifunctional layer 116E/T as shown in FIG. 6. A single heterostructure OLED may be fabricated by following the steps of the process for fabricating an OLED device 100, wherein step (4) comprises the steps of sequentially depositing HTL 116H and EL/ETL 116E/T, all from a direction substantially perpendicular to substrate 111. An example of suitable organic multifunctional materials can be found in PCT Application WO 96/19792, which is incorporated by reference. Double heterostructure OLEDs generally permit higher efficiencies than single heterostructure OLEDs.

In a single or double heterostructure configuration, the ordering within organic layer(s) 116 may be inverted, i.e. in a double heterostructure configuration, organic layer(s) 116 may be deposited in the order: ETL 116T, EL 116E, and HTL Li 116H, instead of HTL 116H, EL 116E, and ETL 116T, and in a single heterostructure configuration, organic layer(s) 116 may be deposited in the order: EL/ETL 116 E/T followed by HTL 116H. An OLED with inverted layers is referred to as an organic inverted LED, or OILED. The biasing of bottom electrodes 112 and top electrodes 117 should be such that an anode contacts organic layers through which holes are transported, and a cathode contacts organic layers through which electrons are to be transported, i.e., in a double heterostructure configuration that has not been inverted, bottom electrode 112 should be an anode, which transports electrons away from HTL 116H, and top electrode 117 should be a cathode, which transports electrons to ETL 116T.

The organic emissive layer 116E of the present invention can be any suitable OLED material, and can emit light of any wavelength. Suitable organic emitting materials are described in PCT Application WO 96/19792 and U.S. Pat. No. 5,294,870, which are incorporated by reference.

Figure 7:
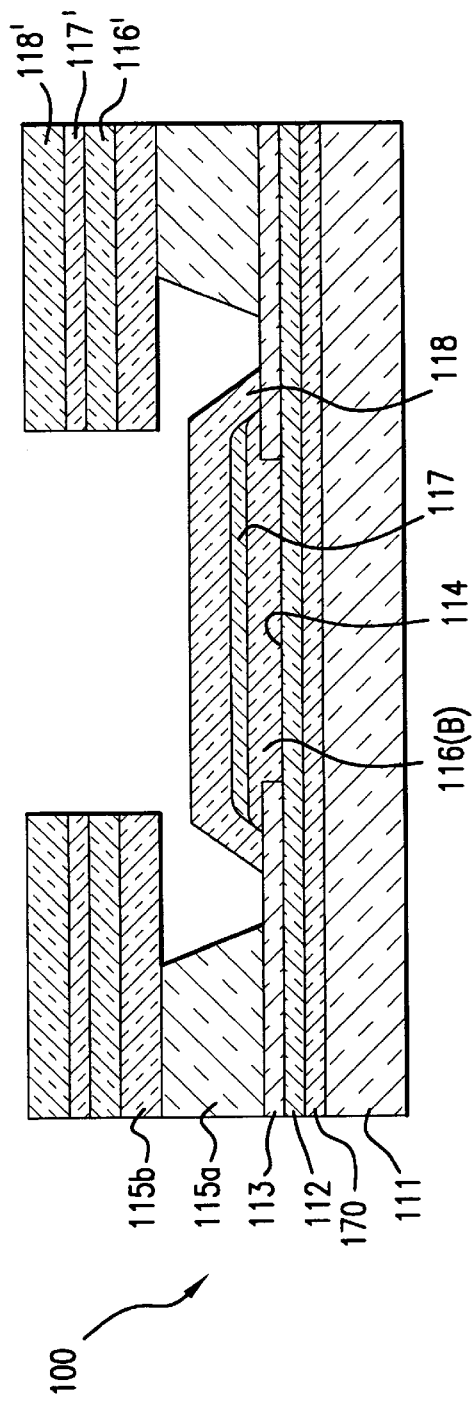
FIG. 7 is a cross-section of an embodiment of the present invention with a phosphor down conversion layer.

As shown in FIG. 7, a colored down conversion phosphor layer 170 may optionally be included between organic layer(s) 116 and substrate 111, preferably between bottom electrode 112 and substrate 111, for down conversion of the light emitted from the OLED emission layer to a desired color. Down conversion phosphor layer 170 may also be deposited on either side of substrate 111. For example, a blue OLED layer 116(B) may emit blue light, which is converted down to red light by down conversion phosphor layer 170. The embodiment shown in FIG. 7 is designed to produce monochromatic red light emission. The device of 100 FIG. 7 may be fabricated by depositing and patterning down conversion phosphor layer 170 onto substrate 111 using any suitable technique, and then following the steps of the process for fabricating an OLED device 100. Green and red down conversion phosphors are known in the art, as disclosed by U.S. Pat. No. 5,294,870 to Tang, which is incorporated by reference.

The present invention includes monochrome products comprising an array of pixels, wherein each pixel comprises a number of devices 100 that emit the same or substantially the same colors of light fabricated next to each other, as well as multi-color products comprising an array of pixels, wherein each pixel comprises a number of devices 100 that emit different colors of light fabricated next to each other.

A pixel of a multi-color product could comprise three devices 100, side by side, that emit red, green, and blue light respectively. For example, the different color emissions could be achieved by using different down conversion phosphor layers 170. Such a product could be fabricated by depositing a pattern of green and red down conversion phosphor layers 170 onto substrate 111 using any suitable technique, and then following the steps of the process for fabricating an OLED device 100 to fabricate an array of blue emitting OLED devices 100 on top of the pattern of down conversion phosphor layers 170, such that some of the devices 100 would transmit blue light that is not converted, some of the devices 100 would transmit blue light that is converted to green light, and some of the devices 100 would transmit blue light that is converted to red light.

Alternatively, a pixel of side by side devices 100 that emit different colors could be fabricated using different materials for the organic layer(s) 116 of each device in accordance with an embodiment of the present invention according to the following process:

1) Fabricate an array of OLED devices 100 according to the process for fabricating an OLED device 100, including lift-off, that emit a particular color of light, blue for example, leaving spaces in between the devices 100. Protective caps 118 will protect devices 100 fabricated in the present step during subsequent processing.

2) Fabricate an array of OLED devices 100 that emit a different color of light, green for example, in the spaces left during step (1) of the present process, still leaving some space. Use the process for fabricating an OLED device 100, including lift-off, but start with step (3) of that process, because bottom electrodes 112 and insulating strips 113 are already present from step (1) of the present process. If a patterning system having an insulating layer 115a was used during step (1) of the present process, the existing insulating layer 115a may be used during step (3) of the process for fabricating an OLED device 100. Protective caps 118 will protect devices 100 fabricated in the present step during subsequent processing.

3) Repeat step (2) of the present process, fabricating an array of devices 100 that emit yet another color of light, red for example, in the remaining space.

During each step, the processing conditions should be such that previously fabricated OLEDs are not damaged.

Figure 8:
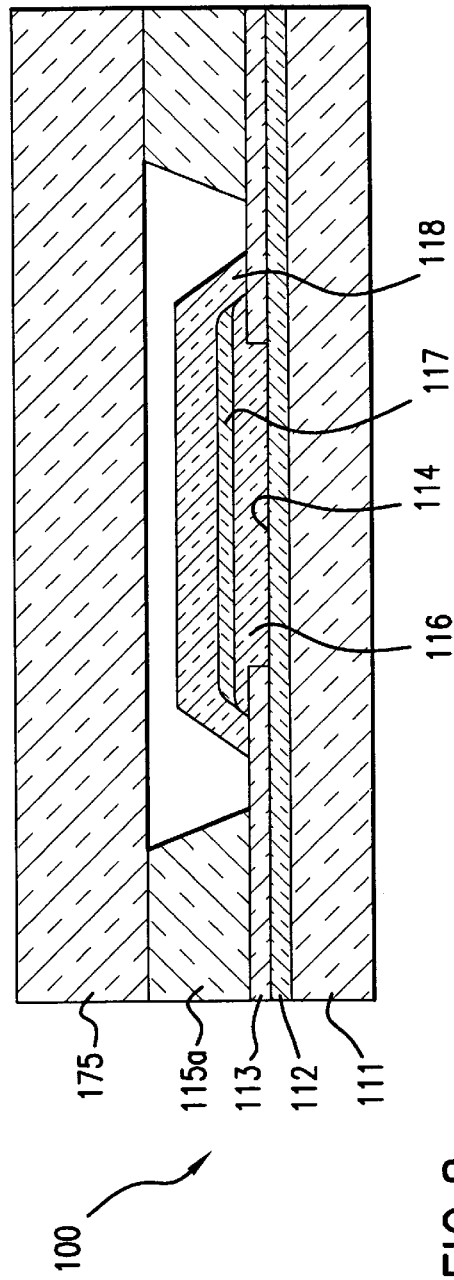
FIG. 8 is a cross section of an embodiment of the present invention with a background of an optically absorbent material.

The present invention may also be used to fabricate transparent OLEDs. A device 100 that is transparent would be well suited for use in a heads-up display, for example on a windshield for a car, or a visor for a motorcycle or airplane helmet. Transparent OLED devices 100 can also be stacked for multi-color products or to enhance intensity. All layers should be transparent to visible light in a transparent OLED. A device 100 that is transparent is also well suited for high contrast applications. High contrast is achieved by placing a background 175 made of an optically absorbent material next to device 100, as shown in FIG. 8. Light incident upon device 100 from external sources passes through device 100 and is absorbed by background 175, reducing the reflection of light from external sources to the viewer.

In one embodiment, the present invention may be used to fabricate a device 100 designed to emit light to a viewer situated on the same side of substrate 111 as device 100. Substrate 111 need not be transparent in this embodiment, and a reflective layer may be deposited onto substrate 111 prior to the fabrication of device 100 in order to reflect light incident upon substrate 111 back towards the viewer. However, top electrode 117, protective cap 118, and any passivation layer 119 should be transparent.

Figure 9:
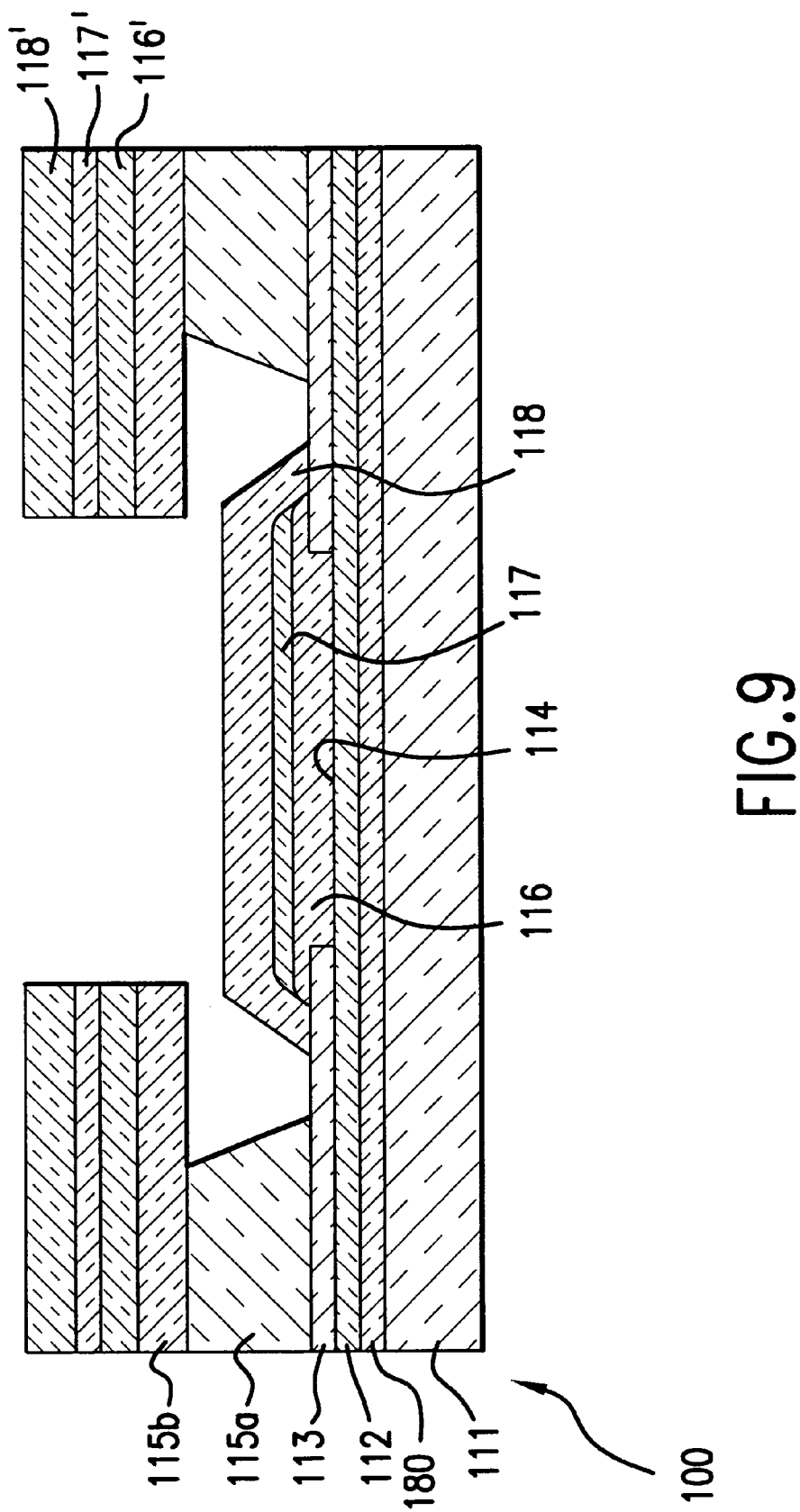
FIG. 9 is a cross-section of an embodiment of the present invention with a loss limiting layer.

The light emitting devices 100 of the present invention can optionally comprise a loss limiting layer 180 of low-loss, high refractive index dielectric material, such as $TiO_2$, beneath bottom electrodes 112, as shown in FIG. 9. A loss limiting layer 180 is especially preferred when bottom electrodes 112 are made from ITO, which is a high-loss material. Without loss limiting layer 180, light from organic layer(s) 116 can be easily waveguided in and absorbed by bottom electrodes 112. The refractive indexes for $TiO_2$ and ITO are about 2.6 and 2.2, respectively. Loss limiting layer 180 therefore substantially eliminates waveguiding and absorption in the ITO. A device 100 with a loss limiting layer can be fabricated by depositing and patterning loss limiting layer 180 onto substrate ill using any suitable technique, and then following the steps of the process for fabricating an OLED device 100.

The deposition techniques for any of the above-listed methods are well known in the art. For example, a preferred method of depositing the organic layers is by thermal evaporation; a preferred method of depositing metal layers is by thermal or electron-beam evaporation; a preferred method of depositing ITO is by electron-beam evaporation or sputtering; a preferred method of depositing phosphor layers is by thermal evaporation; and a preferred method of depositing dielectrics is by plasma-enhanced chemical vapor deposition, sputtering or electron-beam evaporation. However, the present invention contemplates the use of any method of depositing layers of material suitable for use with a patterning system.

The present invention can be used in a wide variety of consumer products, including computers, televisions, telecommunications products with a display component, vehicles, billboards, signs, large area wall, theatre, stadium screens, xerography, heads-up displays for windshields and helmet visors, and video games.

EXAMPLE

A row of devices 100 was fabricated in accordance with the process for fabricating an OLED device 100, as will now be described with reference to FIG. 1:

1) A glass substrate 111 pre-coated with bottom electrode 112, which is made of ITO about 1600 Å thick, was obtained. A suitable glass pre-coated with ITO is obtainable from Donnelly Applied Films Corporation. The present example describes the fabrication of a single row of devices 100, not an array, and a single bottom electrode 112, which is not patterned, covers substantially all of substrate 111. Substrate 111 with bottom electrode 112 was cleaned as follows: (a) submersed in a cleaning solution such as Tergitol, from J.

T. Baker Inc., and deionized water, with ultrasonic agitation, (b) rinsed in deionized water, (c) boiled in 1,1,1-trichlorethane, acetone and 2-propanol. At the end of each step, substrate 111 was dried with a filtered $N_2$ gun.

2) Insulating strips 113 were deposited to a thickness of about 2000 Å, made of dilute Probimide 285, which is a polyimide available from Olin Microelectronic Materials. First, an adhesion promoter, which was 1 part by volume QZ3289 and 9 parts QZ3290, both available from Olin Microelectronic Materials, was spun on. Then, a solution of 2 parts by volume Probimide 285 in 1 part by volume 4-butyrolactone was spun on. Insulating strips 113 were then cured. Insulating strips 113 were next patterned using standard photolithographic techniques to define emitting regions 114 that were 300 microns wide×1.5 mm. long with a period of 500 microns, i.e., separated by 200 micron wide insulating strips 113.

3) Insulating layer 115a, made of $SiO_2$, was deposited to a thickness of about 2 microns using plasma enhanced chemical vapor deposition (PECVD). Photoresist layer 115b, made of AZ4210 photoresist, was deposited to a thickness of about 2 microns. Photoresist layer 115b was patterned by exposing to radiation through a mask with slots 1 cm long (any length greater than the 1.5 mm length of insulating strips 113 would work) and 400 microns wide with a period of 500 microns, with the slots centered above emitting regions 114, and developing in AZ400K, a developer available from Hoechst Celanese Corporation, diluted 1:4 in deionized water. The patterning left 100 micron wide photoresist layers 115b centered over 200 micron wide insulating strips 112.

4) Insulating later 115a was wet etched in a mixture of 200 ml BOE (10:1) and 20 ml hydrofluoric acid (49% in deionized water) at about 21° C., for about 3.4 minutes at a stir speed of about 100 rpm.

5) Organic layer(s) 116 were deposited from a direction substantially perpendicular to substrate 111. Organic layers 116 were deposited in the single heterostructure configuration of FIG. 6, with a hole transport layer 116H, made of α-NPD (4,4'-bis[N-(1-napthyl)-N-phenyl-amino]biphenyl) deposited to a thickness of 400 Å, and a multifunctional layer 116E/T, made of $Alq_3$ (tris(8-hydroxyquinoline) aluminum) deposited to a thickness of about 600 Å.

6) Top electrode 117 was deposited from a direction substantially perpendicular to substrate 111. Top electrode 117 was a cathode formed by thermal co-evaporation of Mg:Ag (atomic ratio 24:1) to a thickness of 250 Å followed by thermal evaporation of Ag to a thickness of 200 Å.

7) Protective cap 118, made of Ag, was deposited by thermal evaporation to a thickness of 1 micron from an angle θ of 45°. With reference to FIG. 3, 0.5 microns were first deposited into undercut 115c(1), and then 0.5 microns were deposited into undercut 115c(2), while substrate 111 was held stationary, to completely cover top electrode 117 and organic layers 116.

8) Photoresist layer 115b, as well as layers 116', 117' and 118', were removed ("lifted-off") by soaking in acetone for 3 minutes and drying under an $N_2$ gun.

Figure 10A:
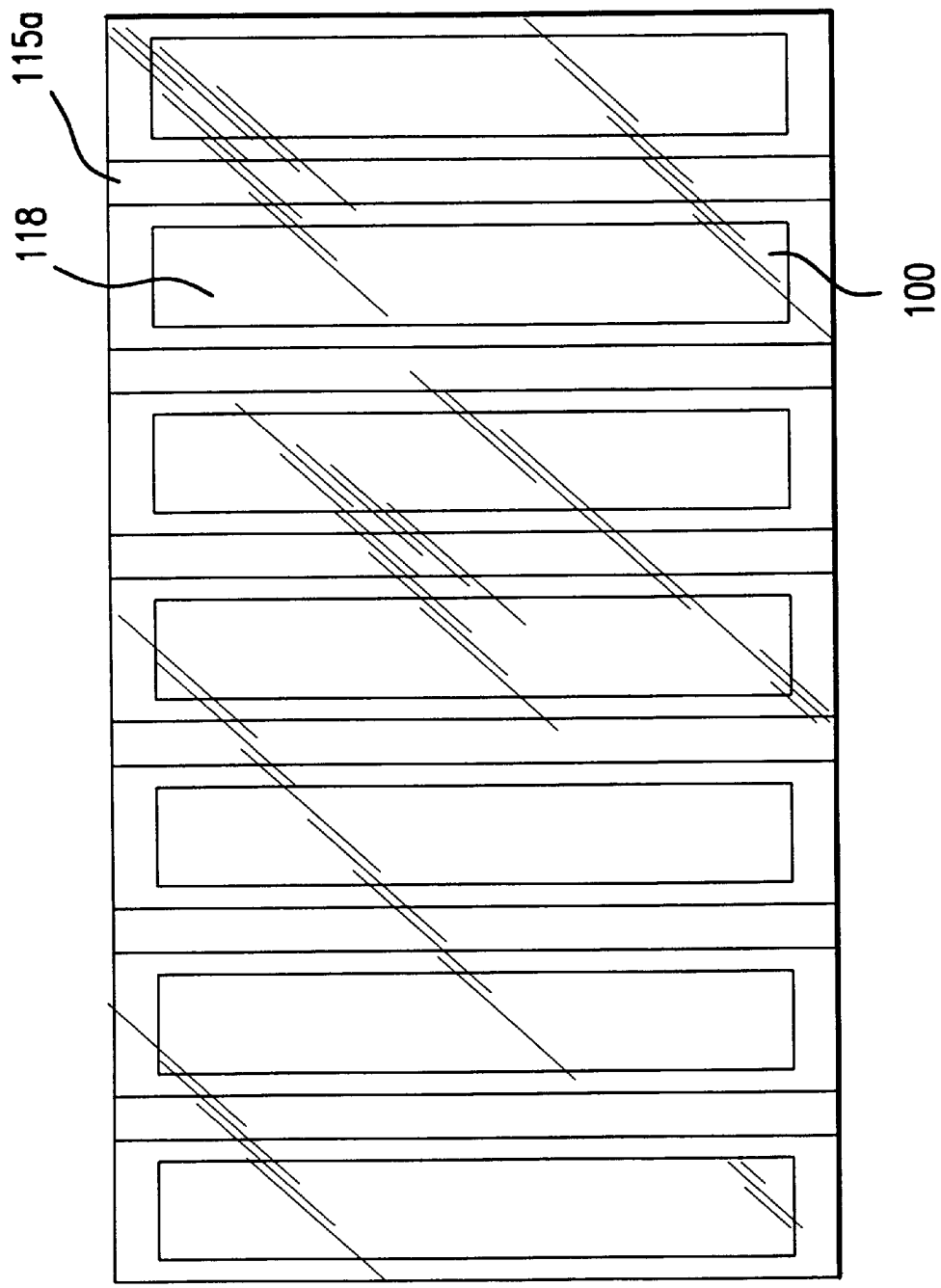
FIG. 10a is an optical micrograph of an embodiment of the present invention.

FIG. 10a is an optical micrograph of a row of devices 100 fabricated according to the foregoing process. Insulating layers 115a and protective caps 118 are clearly visible.

Figure 10B:
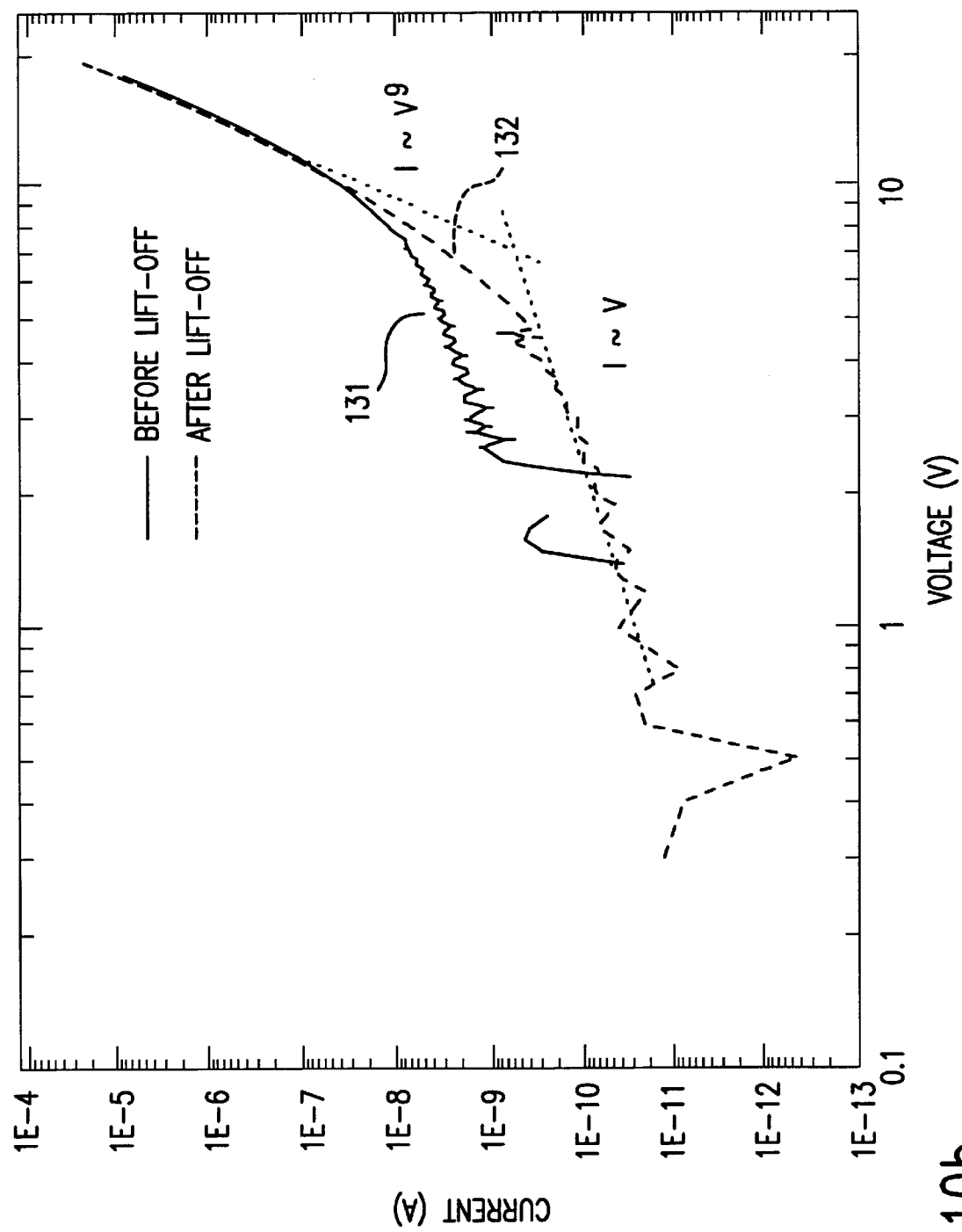
FIG. 10b shows I–V plots, i.e., current v. voltage, for an embodiment of the present invention.

FIG. 10b shows I–V plots for a row of devices 100. Plot 131 shows an I-V plot for devices 100 before the lift-off step (8) was performed. Plot 132 shows an I–V plot for the same devices after lift-off step (8) was performed. Comparing plots 131 and 132, it can be seen that there is no degradation of the I–V curve due to lift-off, again demonstrating that the acetone did not penetrate protective cap 118 during lift-off. Some devices 100 were electrically connected to each other before lift-off, while all devices 100 were electrically isolated after lift-off, suggesting that dangling pieces of layers 116', 117' or 118' may have been connecting some devices 100 prior to lift-off.

Figure 10C:
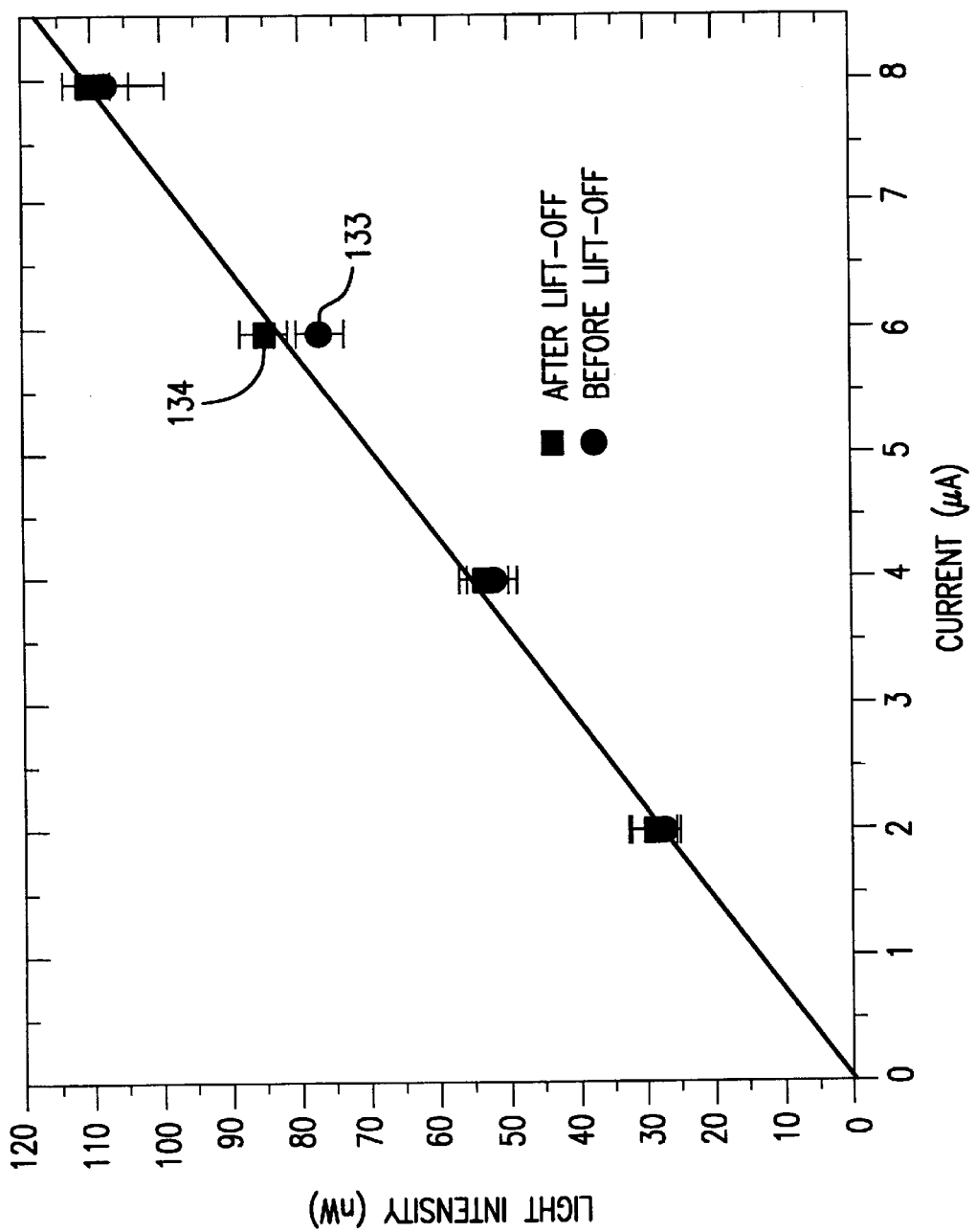
FIG. 10c shows plots of light intensity v. current for an embodiment of the present invention.

FIG. 10c shows plots of intensity of light output v. current for the same row of devices 100 used to generate FIG. 10b. Comparing plot 133, generated before lift-off, and plot 134, generated after lift-off, it can be seen that there is no degradation of light output characteristics due to lift-off, demonstrating that acetone did not penetrate protective cap 118 during lift-off.

The subject invention as disclosed herein may be used in conjunction with co-pending applications: "High Reliability, High Efficiency, Integratable Organic Light Emitting Devices and Methods of Producing Same", Ser. No. 08/774,119 (filed Dec. 23, 1996); "Novel Materials for Multicolor LED's", Ser. No. 08/850,264 (filed May 2, 1997); "Electron Transporting and Light Emitting Layers Based on Organic Free Radicals", Ser. No. 08/774,120 (filed Dec. 23, 1996); "Multicolor Display Devices", Ser. No. 08/772,333 (filed Dec. 23, 1996); "Red-Emitting Organic Light Emitting Devices (LED's)", Ser. No. 08/774,087 (filed Dec. 23, 1996); "Driving Circuit For Stacked Organic Light Emitting Devices", Ser. No. 08/792,050 (filed Feb. 3, 1997); "High Efficiency Organic Light Emitting Device Structures", Ser. No. 08/772,332 (filed Dec. 23, 1996); "Vacuum Deposited, Non-Polymeric Flexible Organic Light Emitting Devices", Ser. No. 08/789,319 (filed Jan. 23, 1997); "Displays Having Mesa Pixel Configuration", Ser. No. 08/794,595 (filed Feb. 3, 1997); "Stacked Organic Light Emitting Devices", Ser. No. 08/792,046 (filed Feb. 3, 1997); "High Contrast Transparent Organic Light Emitting Device Display", Ser. No. 08/821,380 (filed Mar. 20, 1997); "Organic Light Emitting Devices Containing A Metal Complex of 5-Hydroxy-Quinoxaline as A Host Material", Ser. No. 08/838,099 (filed Apr. 15, 1997); "Light Emitting Devices Having High Brightness", Ser. No. 08/844,353 (filed Apr. 18, 1997); "Organic Semiconductor Laser", Ser. No. 60/046,061 (filed May 9, 1997); "Organic Semiconductor Laser", Ser. No. 08/859,468 (filed May 19, 1997); "Saturated Full Color Stacked Organic Light Emitting Devices", Ser. No. 08/858,994 (filed May 20, 1997); "An Organic Light Emitting Device Containing a Hole Injection Enhancement Layer", Ser. No. 08/865,491 (filed May 29, 1997); "Plasma Treatment of Conductive Layers", Ser. No. PCT/US97/10252; (filed Jun. 12, 1997; Patterning of Thin Films for the Fabrication of Organic Multi-Color Displays", Ser. No. PCT/US97/10289 (filed Jun. 12, 1997); "Double Heterostructure Infrared and Vertical Cavity Surface Emitting Organic Lasers", Ser. No. 60/053,176 (filed Jul. 18, 1997); "Oleds Containing Thermally Stable Asymmetric Charge Carrier Materials", Ser. No. 08/929,029 filed (Sep. 8, 1997), "Light Emitting Device with Stack of Oleds and Phosphor Downconverter", Ser. No. 08/925,403 (filed Sep. 9, 1997), "An Improved Method for Depositing Indium Tin Oxide Layers in Organic Light Emitting Devices", Ser. No. 08/928,800 (filed Sep. 12, 1997), "Azlactone-Related Dopants in the Emissive Layer of an Oled" (filed Oct. 9, 1997), Ser. No. 08/948,130, "A Highly Transparent Organic Light Emitting Device Employing A Non-Metallic Cathode", (filed Nov. 3, 1997), Attorney Docket No. 10020/40 (Provisional) ,"A Highly Transparent Organic Light Emitting Device Employing a Non-Metallic Cathode", (filed Nov. 5, 1997), Attorney Docket No. 10020/44, and "Low Pressure Vapor Phase Deposition of Organic Thin films" (filed Nov. 17, 1997), Attorney Docket No. 10020/37, each co-pending application being incorporated herein by reference in its entirety. The subject invention may also be used in conjunction with the subject matter of each of co-pending U.S. patent application Ser. Nos. 08/354,674, 08/613,207, 08/632,322 and 08/693,359 and provisional patent application Ser. Nos. 60/010,013, 60/024,001 and 60/025,501, each of which is also incorporated herein by reference in its entirety.

Those with skill in the art may recognize various modifications to the embodiments of the invention described and illustrated herein. Such modifications are meant to be covered by the spirit and scope of the appended claims.

What is claimed is:

1. A method of fabricating an organic light emitting device, comprising the steps of:
   a. depositing a down conversion phosphor layer;
   b. forming on a substrate a patterning system having an undercut;
   c. depositing an organic light emitting material through the patterning system; and
   c. depositing a protective cap, which completely covers the organic light emitting material, through the patterning system.

2. The method of claim 1, further comprising the step of depositing a bottom electrode and an insulating strip onto the substrate prior to said step of forming a patterning system.

3. The method of claim 2, further comprising the step of depositing a hole transport layer through the patterning system after said step of forming a patterning system and prior to said step of depositing a protective cap.

4. The method of claim 3, wherein said step of depositing a hole transport layer is performed prior to said step of depositing an organic light emitting material.

5. The method of claim 3, further comprising the step of depositing an electron transport layer through the patterning system after said step of forming a patterning system and prior to said step of depositing a protective cap.

6. The method of claim 5, wherein said step of depositing an electron transport layer is performed after said step of depositing an organic light emitting material and said step of depositing a hole transport layer is performed prior to said step of depositing an organic light emitting material.

7. The method of claim 2, further comprising the step of depositing a top electrode after said step of depositing an organic light emitting material and prior to said step of depositing a protective cap.

8. A method of fabricating an organic light emitting device, comprising the steps of:
   a. forming on a substrate a patterning system having an undercut;
   b. depositing an organic light emitting material through the patterning system; and
   c. depositing a protective cap, which completely covers the organic light emitting material, through the patterning system;
   d. depositing on the substrate and patterning a blue to red phosphor conversion layer prior to said step of forming on the substrate a patterning system; and
   e. depositing on the substrate and patterning a blue to green phosphor conversion layer prior to said step of forming on the substrate a patterning system;
   f. wherein the organic light emitting material emits blue light, such that an array of pixels is formed, each pixel containing (i) an organic light emitting device that emits blue light that does not pass through a phosphor conversion layer, (ii) an organic light emitting device that emits blue light that passes through the blue to red down conversion phosphor layer, and (iii) an organic light emitting device that emits blue light that passes through the blue to green down conversion phosphor layer.

9. The method of claim 1, further comprising the step of removing the patterning system.

10. The method of claim 1, further comprising the step of depositing a loss limiting layer.

11. A method of fabricating an organic light emitting device, comprising the steps of:
   a. forming on a substrate a first patterning system having an undercut;
   b. depositing a first organic light emitting material through the first patterning system;
   c. depositing a separation layer;
   d. forming on the separation layer a second patterning system having an undercut;
   e. depositing an organic light emitting material through the second patterning system.

12. A method of fabricating an organic light emitting device, comprising the steps of:
   a. forming on a substrate a first patterning system having an undercut;
   b. depositing a first organic light emitting material through the first patterning system;
   c. depositing a first protective cap which completely covers the first organic light emitting material, through the first patterning system;
   d. forming on the first protective cap a second patterning system having an undercut;
   e. depositing a second organic light emitting material through the second patterning system; and
   f. depositing a second protective cap, which completely covers the second organic light emitting material, through the second patterning system.

13. The method of claim 1, wherein the protective cap extends into the undercut further than the organic light emitting material by about 0.5 to 5 microns.

14. The method of claim 1, wherein the protective cap extends into the undercut further than the organic light emitting material by about 0.5 to 2 microns.

15. The method of claim 1, wherein the protective cap extends into the undercut further than the organic light emitting material by about 1 micron.

16. A method of fabricating an organic light emitting device, comprising the steps of:
   a. depositing a down conversion layer;
   b. depositing and patterning a bottom electrode onto a substrate;
   c. depositing and patterning an insulating strip over the result of said step of depositing and patterning a bottom electrode;
   d. forming a patterning system having an undercut over the result of said step of depositing an insulating strip;
   e. depositing an organic light emitting material through the patterning system; and f. depositing a protective cap, which completely covers the organic light emitting material, through the patterning system.

17. The method of claim 16 wherein said step of depositing an organic light emitting material and said step of depositing a protective cap occur in a vacuum without removing the substrate from vacuum.

18. The method of claim 16, further comprising the step of depositing a hole transporting layer through the patterning system after said step of forming a patterning system and prior to said step of depositing a protective cap.

19. The method of claim 18, further comprising the step of depositing an electron transporting layer through the patterning system after said step of forming a patterning system and prior to said step of depositing a protective cap.

* * * * *

UNITED STATES PATENT AND TRADEMARK OFFICE
CERTIFICATE OF CORRECTION

PATENT NO. : 6,013,538

DATED : January 11, 2000

INVENTOR(S) : Paul Burrows, et al.

It is certified that error appears in the above-identified patent and that said Letters Patent is hereby corrected as shown below:

Column 1, line 5, after "Contract No." delete "F33615-94-1-1444" and insert therefor -- F33615-94-1-1414 -- ;

Column 3, line 36, after "invention" insert -- . --;

Column 7, line 23, after "angle" (second occurrence) change "e" to -- $\theta$ -- ;

Column 10, line 39, delete "Li";

UNITED STATES PATENT AND TRADEMARK OFFICE
CERTIFICATE OF CORRECTION

PATENT NO. : 6,013,538

DATED : January 11, 2000

INVENTOR(S) : Paul Burrows, et al.

It is certified that error appears in the above-identified patent and that said Letters Patent is hereby corrected as shown below:

Column 12, line 31, after "substrate" change "ill" to -- 111 -- ;

Column 15, line 27, before "depositing a protective cap" change "c." to -- d. --.

Signed and Sealed this

Third Day of April, 2001

*Attest:*

NICHOLAS P. GODICI

*Attesting Officer*     *Acting Director of the United States Patent and Trademark Office*